United States Patent [19]
Jensen

[11] Patent Number: 5,159,283
[45] Date of Patent: Oct. 27, 1992

[54] POWER AMPLIFIER

[75] Inventor: Ole H. Jensen, Copenhagen, Denmark

[73] Assignee: Motorola, Inc., Schaumburg, Ill.

[21] Appl. No.: 756,268

[22] Filed: Aug. 26, 1991

[51] Int. Cl.$^5$ ............................................. H03G 3/20
[52] U.S. Cl. .................................. 330/129; 330/138;
330/279; 375/71; 455/126; 455/127
[58] Field of Search ............... 330/129, 130, 138, 279;
375/68, 71, 98; 455/116, 126, 127

[56] References Cited

U.S. PATENT DOCUMENTS

| | | | |
|---|---|---|---|
| 4,322,689 | 3/1982 | Schucht | 330/295 X |
| 4,592,073 | 5/1986 | Watanabe | 455/126 X |
| 4,992,753 | 2/1991 | Jenson et al. | 330/129 |

Primary Examiner—James B. Mullins
Attorney, Agent, or Firm—Kenneth W. Bolvin

[57] ABSTRACT

The power amplifier in accordance with the invention is responsive to a power level control signal so as to amplify radio frequency signals to define any one of a plurality of amplifier output power envelopes. The power amplifier comprises means for generating a predetermined time varying signal which represents a predetermined one of the plurality of amplifier output power envelopes, means for modifying the time varying signal in response to the power level control signal for definition of a selected output power envelope and control means for controlling the amplifier output power in response to the modified time varying signal to amplify the radio frequency signal according to the selected one of said plurality of output power envelopes. The time varying signal may be a sequence of values stored in memory. The modifying means may be a clipper which clips the time varying signal at a value that depends on the power level control signal or a multiplier that multiplies the time varying signal by a value that depends on the power level control signal or a subtractor that subtracts a value from the time varying signal which depends on the power level control signal.

9 Claims, 2 Drawing Sheets

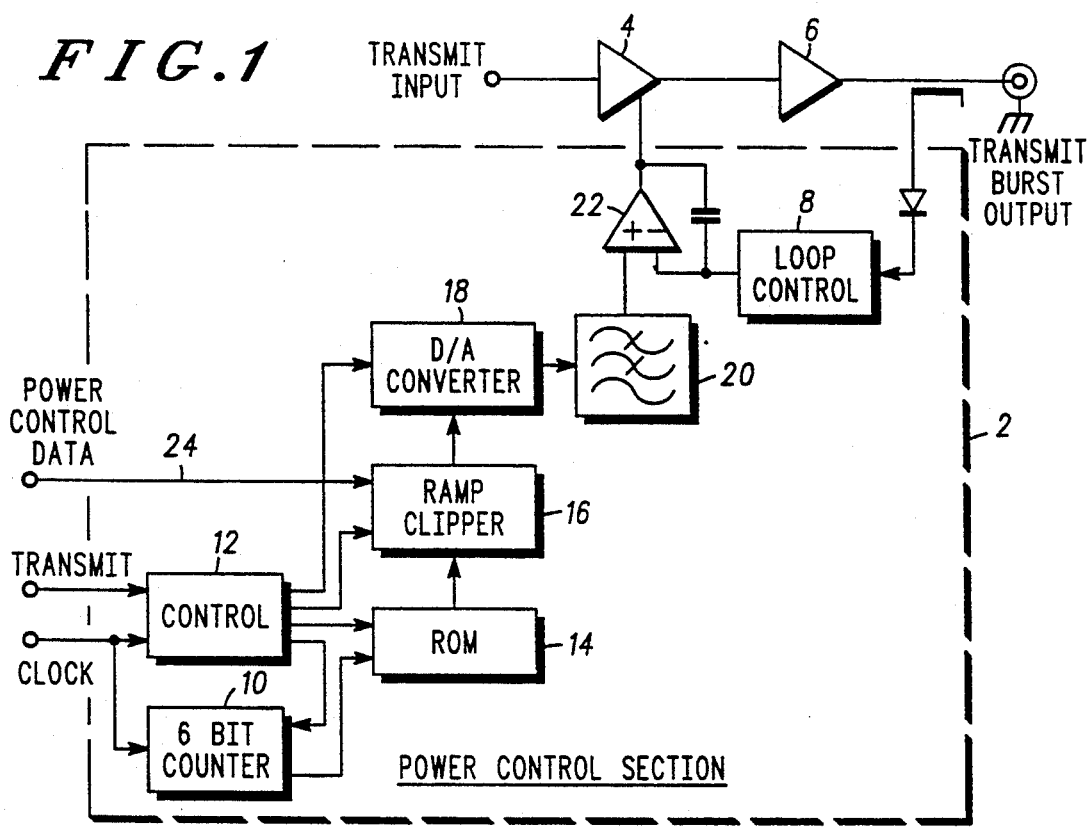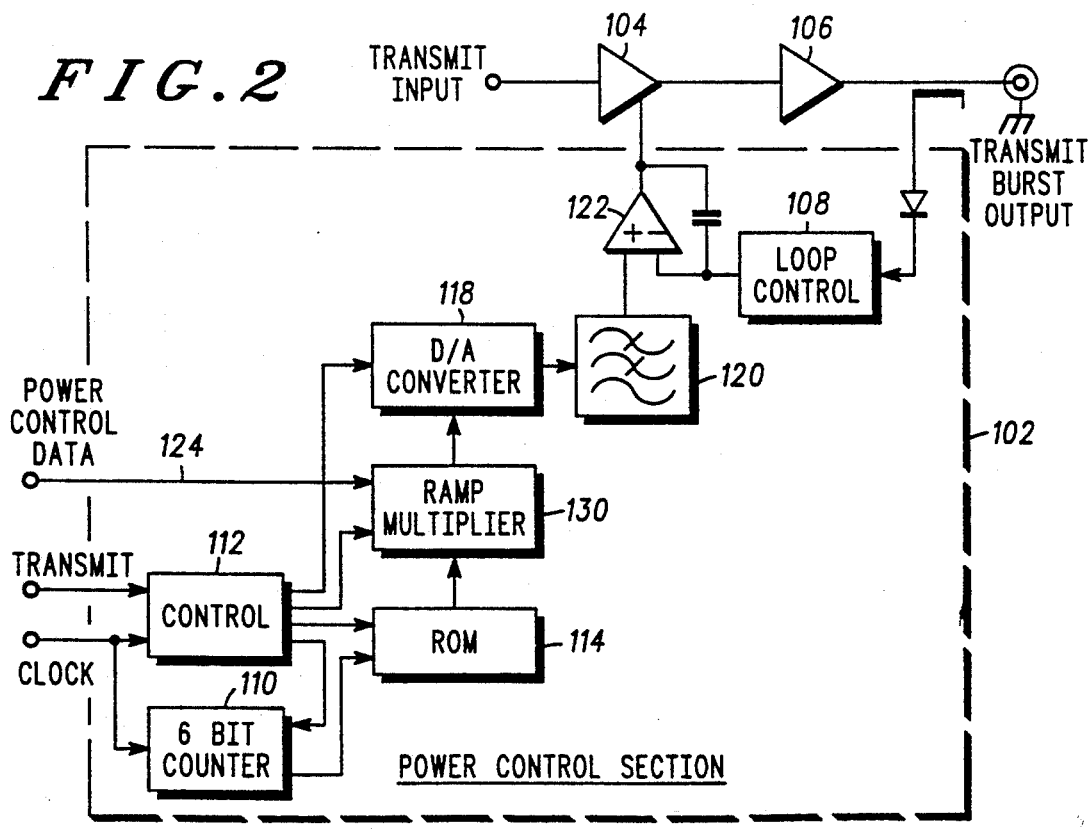

POWER AMPLIFIER

FIELD OF THE INVENTION

This invention relates to power amplifiers, such as pulsed power amplifiers, for amplifying radio frequency signals. This invention particularly relates to power amplifiers for use in GSM radio transmitters.

BACKGROUND OF THE INVENTION

A pulsed power amplifier which may be used in GSM mobile radio transmitters is described in UK patent application no. 8826918.8, the disclosure of which is incorporated herein by reference. This application discloses a burst modulated power amplifier whose output power characteristics upon turn-on and turn-off are controlled by power control signals which are dependent on a sequence of values stored in a memory of a power control section of the power amplifier. The power amplifier can operate at a number of different output power levels and a sequence of values is stored in the memory for each of these power levels. Once a power level has been selected, the corresponding sequence of values is selected and read from the memory.

The output power of a GSM mobile radio transmitter must be adjustable between sixteen power levels. In order to account for tolerance factors within the amplifier which will affect the ultimate output power, there are generally sixteen nominal power levels which are each split into four sub-levels close to the nominal value. A transmit controller of the power control section can then determine which of the sixty-four sublevels is best to represent each one of the sixteen nominal power levels. There are therefore sixty-four sequences of values stored in the memory corresponding to the sixty-four power levels.

Each of the sequences of values represents a ramp-up waveform and a ramp-down waveform corresponding to turn-on and turn-off respectively. One ramp-up waveform can be satisfactorily represented by a sequence of 64 bytes (512 bits) to be stored in the memory and one ramp-down waveform can be satisfactorily represented by a sequence of 64 bytes to be stored in the memory. Thus, the total number of bytes of memory required to store the sixty-four sequences of values is 8192 bytes (65536 bits). This is significantly large particularly when the power control section is integrated in an integrated circuit.

It is therefore desirable to reduce the number of bytes of memory required to store all the sequences of values for the different power levels.

SUMMARY OF THE INVENTION

In accordance with a first aspect of the invention there is provided a power amplifier being responsive to a power level control signal for amplifying radio frequency signals to define any one of a plurality of amplifier output power envelopes, the power amplifier comprising:

means for generating a predetermined sequence of values that represent a predetermined one of said plurality of amplifier output power envelopes;

means for modifying said time varying signal in response to said power level control signal to provide a modified sequence of values that define a selected output power envelope; and control means for controlling the amplifier output power in response to the modified sequence of values to amplify the radio frequency signal according to the selected one of said plurality of output power envelopes.

In a preferred embodiment, the modifying means comprises means for clipping the sequence of values at a value which depends on the power level control signal.

In a second embodiment of the invention the modifying means comprises means for multiplying sequence of values signal by a scaling factor which depends on the power level control signal.

In a third embodiment of the invention the modifying means comprises combining means for combining a value with the sequence of values. The value depends on the power level control signal and may be a negative number or a positive number bigger than or equal to zero.

The pulsed power amplifier may further comprise a filter such as a low pass filter in order to smooth waveforms generated by the modified sequence of values.

Thus, it will be appreciated that by generating one sequence of values representing one ramp-up and one ramp-down waveform for all the different power levels and using the modification means to modify the values in response to a particular power level, a ramp-up waveform and ramp-down waveform represented by a modified sequence of values can be obtained for any of the power levels and since only one sequence of values need be generated the total number of values is considerably reduced. For the prior art power amplifier described above, for example, only 128 bytes will be required instead of 8192 bytes.

BRIEF DESCRIPTION OF THE DRAWINGS

Three pulsed power amplifiers for amplifying radio frequency signals will now be described, by way of example, only with reference to the accompanying drawings in which:

FIG. 1 is a block schematic diagram of a first pulsed power amplifier in accordance with the present invention.

FIG. 2 is a block schematic diagram of a second pulsed power amplifier in accordance with the present invention.

FIG. 4 shows a diagrammatic representation of a typical output power versus time response of the pulsed power amplifier shown in FIG. 1 during turn-on.

DETAILED DESCRIPTION OF THE PREFERRED EMBODIMENT

Figure 3:
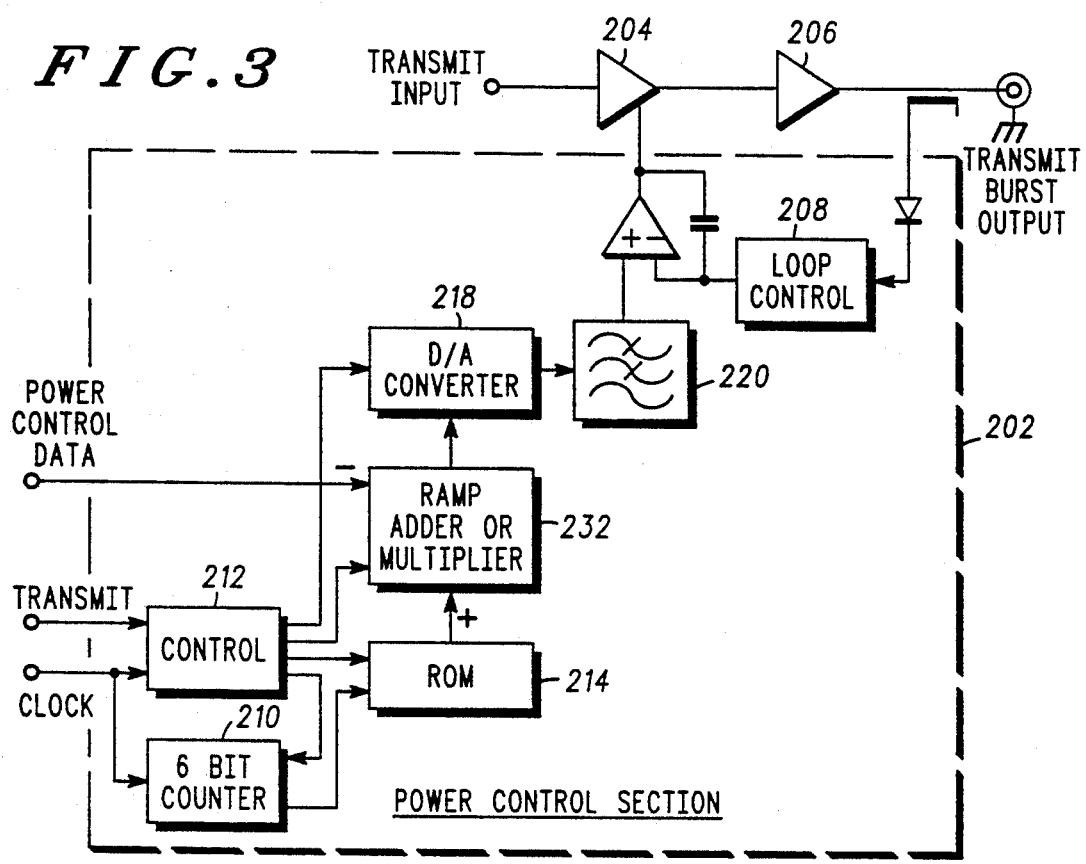
FIG. 3 is a block schematic diagram of a third pulsed power amplifier in accordance with the present invention.

Referring to FIG. 1, a power control section 2 is shown coupled to an attenuator 4 which is controlled by a feedback loop 8. An RF signal is supplied to an input of the attenuator 4 whose output is coupled to a RF power amplifier 6. The output of the power amplifier is fed to an antenna (not shown).

The power control section 2 has a clock input CLK coupled to a six-bit counter 10 which is coupled to the address lines of a ROM 14. A control 12, also coupled to the counter 10 and the ROM 14, is controlled by the signal on the clock input CLK and a signal on the transmit input TX. The control 12 is coupled to a ramp clipper 16 and to a digital-to-analog converter 18. ROM 14 provides an eight bit output which is fed to the ramp clipper 16. The ramp clipper 16 is controlled by power control data on a power control data line 24 and its output is fed to the digital-to-analog converter 18, from which the resulting analog signal is fed via a low pass smoothing filter 20 to a comparator amplifier 22 which is coupled to the attenuator 4.

Figure 4:
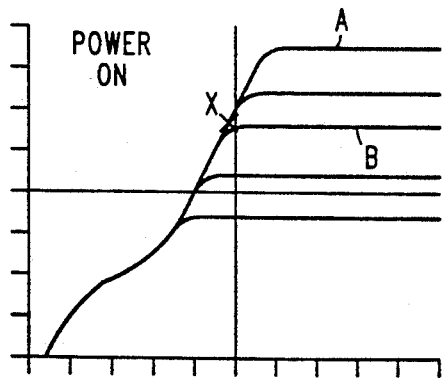
Figure 5:
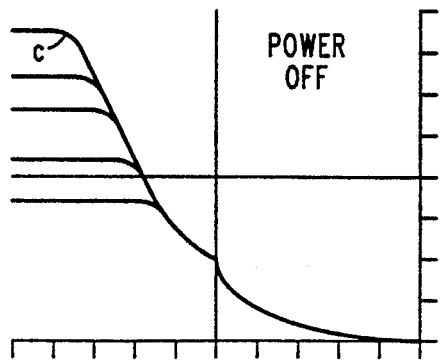
FIG. 5 shows a diagrammatic representation of a typical output power versus time response of the pulsed power amplifier shown in FIG. 1 during turn-off.

A sequence of values representing one ramp-up and one ramp-down waveform is stored in the ROM 14. Since in the preferred embodiment sixty-four bytes are required to represent a ramp-up waveform, such as the ramp-up waveform A in FIG. 4, and sixty-four are required to represent a rampdown waveform, such as the ramp-down waveform C in FIG. 5, the total number of bytes required is 128 bytes. The sequence of values is addressed according to the signal on the address lines coupled to the counter 10.

The operation of the power amplifier in accordance with the invention will now be described. However, since the operation of a power amplifier has been described in detail in the above referenced patent application the operation will not be described in detail.

At the start of transmission of a RF signal, a transmit controller (not shown) selects a power level and sends a corresponding signal on the power control data line 24 to the ramp clipper 16. In addition, the transmit controller (not shown) provides a transmit control signal indicating the start of transmission to the transmit input TX and provides the RF idata to be fed to the input of the attenuator 4. On receipt of a 'start' signal at the transmit input TX, under the control of the counter 10 and control 12, the sequence of values representing a ramp-up waveform is read from the ROM 14 and fed to the ramp clipper 16. At the end of the transmission, the transmit controller (not shown) provides an 'end' signal to the transmit input TX whereby, under the control of the counter 10 and control 12, the sequence of values representing the ramp-down waveform C is read from the ROM 14 and fed to the ramp clipper 16.

The power control data signal sent on the power control data line 24 controls the clipping level of the ramp clipper 16. That is, it determines the value in the sequence of values representing a ramp-up waveform to which all the following values in the sequence are clipped. The ramp clipper 16 adds the power control data to the value from the ROM 14 and when this sum exceeds a predetermined threshold, clocking of the digital-to-analog converter 18 is stopped and the last clocked value is continuously output from the digital-to-analog converter. For example, the ramp-up waveform A is clipped above the point X if the power level represented by waveform B is selected. For a ramp-down waveform the signal determines the value in the sequence of values to which all the preceding values in the sequence are clipped. Thus, the ramp clipper 16 in response to the signal on the power control data line 24 clips the sequence of values at a value that depends on the power control data signal in order to obtain ramp-up and ramp-down waveforms which correspond to the selected power level. The output of the ramp clipper is then fed to the analog-to-digital converter 18 to be smoothed by a low pass filter 20. The output power of the power amplifier is thus controlled by the output from the low pass filter which is supplied to the comparator amplifier 22 and the attenuator 4.

The signal on the power control data line 24 is constant during a burst, i.e. during turn-on of the burst modulated power amplifier, and can be changed between bursts so that a different power level is selected for the next burst. It is necessary to have a smoothing low pass filter since the clipping method will produce sharp edges on the ramp-up and ramp-down waveforms. This reduces the spectral noise generated by the power ramping.

The ramp clipper 16 may be replaced by a ramp multiplier 130 as in FIG. 2 which shows a second pulsed power amplifier incorporating the invention. Like components to those in FIG. 1 are referenced with the same reference numeral plus a hundred. The operation of the second pulsed power amplifier is similar to that of the first described with reference to FIGS. 1, 4 and 5 except that the ramp-up and ramp-down waveforms for the different power levels are obtained by multiplying the ramp-up and ramp-down waveforms stored in the ROM 114 with a scaling factor. The scaling factor is determined by the signal on the power control data line 124.

Alternatively, the ramp clipper 16 of the first pulsed power amplifier may be replaced by a ramp adder or subtractor 232 as in FIG. 3 which shows a third pulsed power amplifier incorporating the invention. Like components to those of FIG. 1 are referenced with the same reference numeral plus two hundred. The operation of the third pulsed power amplifier is similar to that of the first described with reference to FIGS. 1, 4 and 5 except that the ramp-up and ramp-down waveforms for the different power levels are obtained by subtracting a value from the ramp-up and ramp-down waveforms stored in the ROM 214. The value to be subtracted is determined by the signal on the power control data line 224.

It will be appreciated that although it is necessary that a smoothing low pass filter be used with a ramp clipper due to the production of sharp edges on the waveforms, such a low pass filter is not necessarily required for the ramp multiplier and ramp subtractor.

It will also be appreciated that although the preferred embodiments of the invention have been described wherein a sequence of sixty-four values are used to represent one ramp-up waveform and another sequence of sixty-four values are used to represent one ramp-down waveform and each value comprises eight bits, these numbers are arbitrary and may vary with use of the pulsed power amplifier. In addition, the number of desired power levels may vary with use of the pulsed power amplifier.

I claim:

1. A power amplifier being responsive to a power level control signal for amplifying radio frequency signals to define any one of a plurality of amplifier output power envelopes, the power amplifier comprising:
   means for generating a predetermined sequence of values that represent a predetermined one of said plurality of amplifier output power envelopes;
   means for modifying said sequence of values in response to said power level control signal to provide a modified sequence of values that define a selected output power envelope; and
   control means for controlling the amplifier output power in response to the modified sequence of values to amplify the radio frequency signal according to the selected one of said plurality of output power envelopes.

2. A power amplifier according to claim 1 wherein said means for generating a predetermined sequence of values comprises read only memory for storing the sequence of values which represent a predetermined one of said plurality of amplifier output power envelopes.

3. A power amplifier according to claim 1 wherein said power amplifier further comprises means for generating an analog signal for each value of said modified sequence of values and a filter for filtering said analog signals so as to provide substantially smooth amplifier output power envelopes.

4. A power amplifier for amplifying radio frequency signals according to claim 1 wherein said modifying means comprises means for clipping said sequence of values at a value which depends on the power level control signal.

5. A power amplifier according to claim 1 wherein said modifying means comprises means for multiplying said sequence of values by a value which depends on the power level control signal.

6. A power amplifier according to claim 1 wherein said modifying means comprises combining means for combining a value with said sequence of values, said value depending on the power level control signal.

7. A power amplifier according to claim 6 wherein said value can be any number greater than or equal to zero.

8. A power amplifier according to claim 6 wherein said value can be any negative number.

9. A method of amplifying radio frequency signals by a pulsed power amplifier having a plurality of amplifier output power envelopes in response to a power level control signal comprising the steps of:

generating a predetermined sequence of values that represent a predetermined one of said plurality of amplifier output power envelopes;

modifying said sequence of values in response to said power level control signal; and controlling the amplifier output power in response to the modified sequence of values.

* * * * *